United States Patent
Popescu

(10) Patent No.: US 11,269,034 B2
(45) Date of Patent: Mar. 8, 2022

(54) BASIC FIELD MAGNET ARRANGEMENT FOR A MAGNETIC RESONANCE TOMOGRAPHY SYSTEM

(71) Applicant: Siemens Healthcare GmbH, Erlangen (DE)

(72) Inventor: Stefan Popescu, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 1 day.

(21) Appl. No.: 16/869,897

(22) Filed: May 8, 2020

(65) Prior Publication Data
US 2020/0355771 A1 Nov. 12, 2020

(30) Foreign Application Priority Data

May 9, 2019 (EP) .................................... 19173594

(51) Int. Cl.
*G01R 33/32* (2006.01)
*G01R 33/48* (2006.01)

(52) U.S. Cl.
CPC ........... *G01R 33/481* (2013.01); *G01R 33/32* (2013.01)

(58) Field of Classification Search
CPC .... G01R 33/481; G01R 33/32; G01R 33/543; G01R 33/5608; G01R 33/5607; G01R 33/4828; G01R 33/4835; G01R 33/3415; G01R 33/283; G01R 33/307; G01R 33/60; G01R 33/50; G01V 3/32; E21B 49/08; E21B 2049/085; G01N 24/10
See application file for complete search history.

(56) References Cited

U.S. PATENT DOCUMENTS 4,864,240 A * 9/1989 Young ................ G01R 33/3806
324/318
5,378,988 A * 1/1995 Pulyer ................ G01R 33/3806
324/318

(Continued)

FOREIGN PATENT DOCUMENTS

EP 0860707 A2 8/1998
EP 1251361 A2 10/2002

(Continued)

OTHER PUBLICATIONS

European Search Report dated Sep. 11, 2019, EP Application No. 19173594.3.

*Primary Examiner* — Jermele M Hollington
*Assistant Examiner* — Taqi R Nasir
(74) *Attorney, Agent, or Firm* — Schiff Hardin LLP

(57) ABSTRACT

A basic field magnet arrangement for a magnetic resonance tomography system can include a plurality of basic field magnet segments spatially separated from one another, each being configured to generate an intended magnetic field having a defined segment main field direction. At least two basic magnet segments of the plurality of the basic field magnet segments are arranged relative to one another such that the respective segment main field directions of their intended magnetic fields extend at a deflection angle to one another such that the intended magnetic fields of the at least two basic field magnet segments produce an intended basic magnetic field. The intended basic magnetic field including a basic magnet main field direction can have a ring-shaped profile.

19 Claims, 9 Drawing Sheets

(56) References Cited

U.S. PATENT DOCUMENTS

| | | | |
|---|---|---|---|
| 6,211,676 B1* | 4/2001 | Byrne | G01R 33/3806 |
| | | | 324/319 |
| 2002/0190715 A1* | 12/2002 | Marek | G01R 33/34076 |
| | | | 324/318 |
| 2003/0110564 A1 | 6/2003 | Koshino et al. | |
| 2012/0245454 A1 | 9/2012 | Trequattrini et al. | |
| 2012/0265050 A1 | 10/2012 | Wang | |
| 2016/0111192 A1 | 4/2016 | Suzara | |
| 2017/0108567 A1* | 4/2017 | Bhat | G01R 33/5611 |
| 2019/0317168 A1 | 10/2019 | Popescu | |

FOREIGN PATENT DOCUMENTS

| | | |
|---|---|---|
| EP | 3557276 A1 | 10/2019 |
| GB | 2558685 A | 7/2018 |
| WO | 2008065389 A1 | 6/2008 |

* cited by examiner

BASIC FIELD MAGNET ARRANGEMENT FOR A MAGNETIC RESONANCE TOMOGRAPHY SYSTEM

CROSS REFERENCE TO RELATED APPLICATIONS

This patent application claims priority to European Patent Application No. 19173594.3, filed May 9, 2019, which is incorporated herein by reference in its entirety.

BACKGROUND

Field

The disclosure relates to a basic field magnet arrangement for a magnetic resonance tomography system, to a corresponding magnetic resonance tomography system, and to a method for measuring raw data for a magnetic resonance tomography scan.

Related Art

The principle of magnetic resonance ("MW") tomography ("MW") has been used for imaging and for other measurements for more than four decades. In spite of this long history and the importance that this measurement method has acquired in the meantime, only two magnet designs have so far been used in the prior art for clinically deployed MR systems or MR scanners: C magnet shapes and solenoids. The operation of this type of MR scanner continues to pose problems for the clinical MR workflow.

The most serious problems arise with regard to the far-reaching stray magnetic fields around the scanners. In order to deal with this limitation and avoid accidents and damage, the hospital administration must demarcate a strictly controlled area within and in the vicinity of the MR examination rooms by restricting access by human beings and devices. Damage can occur if metallic or magnetic parts are attracted by the strong magnets of the MR scanners and propelled at high speed in the direction of the scanner volume.

A further problem resides in the fact that MR scanners that employ a solenoid magnet design "enclose" patients in a narrow patient tunnel, which in particular can cause feelings of anxiety on account of the confined space. This anxiety can reach such proportions in some patients that it is not possible to perform an MR scan. Moreover, access by medical staff to the body of the patient is considerably restricted due to the narrowness of the patient tunnel, which is detrimental when it comes to performing interventional or therapeutic procedures, in particular with regard to real-time MR imaging.

Furthermore, conventional MR scanners are difficult to move from one location to another because of their mass, which is due in particular to a magnetic yoke or materials used for shielding the magnetic field. Transporting such equipment within a hospital institution or department or by means of trucks or aircraft is especially problematic. It is therefore difficult to deploy a magnetic resonance tomography system ("MR system") for scanning patients at remote locations or in geographical regions that are confronted by natural catastrophes or military conflicts. A patient must always be brought to an MR system since it has not been possible until now to transport an MR system quickly to a location without problems.

Typically, MR scanners use a self-shielded, superconducting magnet of the solenoid type in order to reduce the strength of the stray magnetic field which exits from the coil of the basic field magnet. Moreover, an actively shielded basic field magnet is significantly more expensive than an unshielded one.

Furthermore, the shielding coils reduce the efficiency of the basic magnetic field that can be used for measurements in a patient tunnel. Actively shielded magnets have a greater diameter than unshielded magnets, the outer diameter of typically 145 cm in the unshielded case increasing to over 220 cm in the shielded case. The magnetic stray field is nonetheless not eliminated completely in the shielded case, but merely reduced, such that a strong, high-intensity stray magnetic field is always present in the examination room even when shielded basic field magnets are used. The stray field is still so strong that the use of magnetic equipment or medical instruments in the examination room is not allowed under current regulations.

Alternative designs for MR scanners employ a C-shaped magnet. This may be either a permanent magnet or an electromagnet consisting of two Helmholtz coils. The C-shaped magnets have two magnetic pole shoes which generate a vertical basic magnetic field in their interspace. An analogous construction is a portal magnet, which is mechanically more robust and in certain embodiment variants may also be realized using superconducting Helmholtz coils. The C shape and the portal magnets have the advantage of allowing open access to the body of the patient and at the same time reduce claustrophobic sensations experienced by patients. However, such a construction requires a very robust mechanical design in order to counteract the enormous magnetic pulling force between the two oppositely disposed basic field magnets. In order to reduce the propagation of stray magnetic fields, these magnet architectures typically make use of an iron yoke for guiding the magnetic field lines outside of the imaging volume. The iron yoke is one of the most cost-effective types of shielding. The disadvantage of such a yoke is the massive increase in the size, weight and volume of the MR scanner.

The magnetic shielding effect of an iron yoke can be reduced at higher field strengths due to the saturation of the material and the nonlinear behavior. For magnets composed of superconducting coils or electromagnets, an active shielding of the stray field can be achieved by means of additional external coils having opposite polarity to the main coils. This actively shielded solution operates in a similar manner to the solenoidal basic field magnet, and also has corresponding disadvantages.

Approaches based on passive shielding of the entire MR scanner room using heavy and thick iron walls have also been adopted in order to get round this problem. However, this is a very expensive solution and no reduction at all in the stray magnetic field is achieved inside the scanner room.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
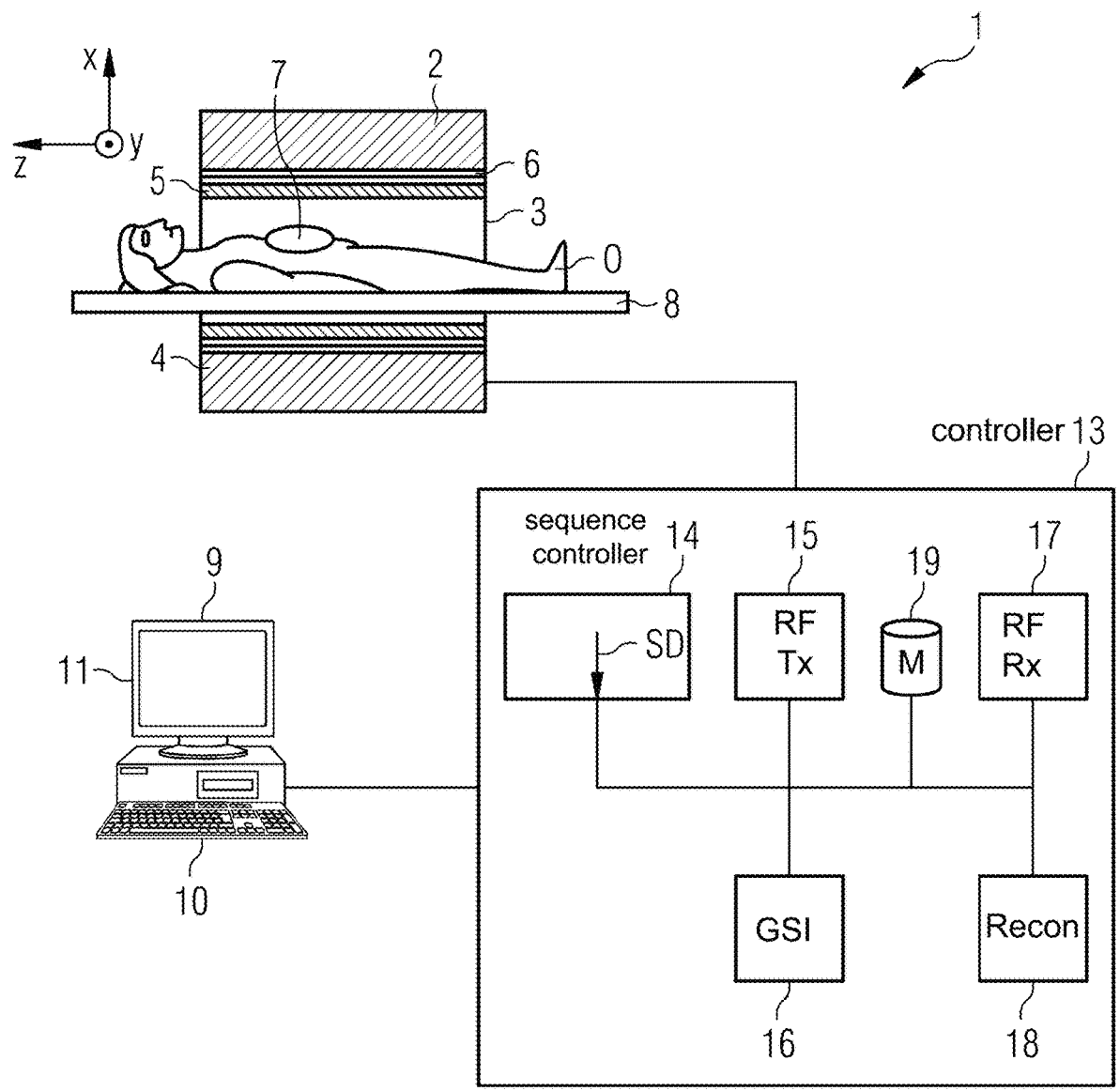
FIG. 1 shows a schematic view of a conventional magnetic resonance tomography system.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to provide an alternative basic field magnet arrangement or, as the case may be, an improved magnetic resonance tomography system by means of which the above-described disadvantages are at least reduced, and preferably avoided.

The basic field magnet arrangement according to the disclosure (which may also be referred to as a "basic field magnet system") for a magnetic resonance tomography system comprises a plurality of (active) basic field magnet segments spatially separated from one another and provided in order to generate in each case (during operation) an intended magnetic field having a defined segment main field direction.

The basic field magnet segments in this case constitute parts of the basic field magnet arrangement and comprise at least one basic field magnet which is defined by means of at least one magnetic coil. However, a plurality of individual basic field magnets or magnetic coils may also be combined to form a basic field magnet segment. Even if a yoke is not ruled out in a basic field magnet, it is nonetheless of advantage at least for certain applications to design the basic field magnets to be as light as possible, i.e. to dispense with a yoke. In other words, in an exemplary embodiment, the magnetic coils of the basic field magnet segments are embodied without an iron core, possibly with a free space in the core region, or the basic field magnet segments are implemented without an iron yoke. The basic field magnets may be embodied as conventional electromagnets or as superconducting electromagnets. Since the focus here is on the magnetic coils of the basic field magnets, the basic field magnet segments may also be referred to in particular as "basic field magnet coil segments".

An intended magnetic field (and also an intended basic magnetic field) is that magnetic field which forms during operation of a magnet according to the intended purpose, i.e. when a current flows through the magnet. The shape is predetermined by the design of the magnet, the strength of the intended magnetic field scaling in intensity at different current strengths. Since Helmholtz coils are generally used in the technical environment of the MR systems, the intended magnetic field of a basic field magnet is in most cases that of a solenoid. The intended magnetic field of a basic field magnet segment or of the basic field magnet arrangement may be more complex, at least when the basic field magnet segment has a different shape from that of a Helmholtz coil.

The main field direction of a magnetic field of a magnet is indicated by that vector that characterizes the magnetic field profile within the magnet. In other words, it is not the stray field that is considered, but the field which is primarily relevant within the context of the known MR systems. In a solenoid magnet, the main field direction would stand perpendicular to the end face of the magnet (solenoid), whereas in a toroidal magnet the main field direction of the magnetic field in the interior of the magnet would point to a circular trajectory. In an arbitrarily shaped magnet, the main field direction reflects the profile of the resulting magnetic field vector of the strongest part of the magnetic field (without the stray field). The mentioned segment main field direction is the main field direction of a magnetic field of a basic field magnet segment.

In a basic field magnet arrangement according to the disclosure, at least two of the basic field magnet segments are arranged relative to one another in such a way that the segment main field directions of their intended magnetic fields extend at a deflection angle to one another. The deflection angle is in this case obviously greater than 0°, since of course no deflection would otherwise be achieved. The relevant basic field magnet segments are furthermore arranged relative to one another in such a way that the intended magnetic fields of the basic field magnet segments result in an intended basic magnetic field (of the basic field magnet arrangement). The basic field magnet segments therefore collectively form the basic magnetic field during operation.

The basic field magnet segments are in this case inventively arranged in such a way that the basic magnetic field has a basic magnet main field direction with an annular profile.

In this context, in an exemplary embodiment, "annular" denotes a closed, ring-shaped profile, preferably in a single spatial plane, preferably in a circular shape or at least a shape having rounded corners. Such an annular magnetic field has a smaller stray field than the magnetic field of a conventional solenoid. The stray field becomes smaller the more basic field magnet segments are used or the more extended the basic field magnet segments are in the direction of the magnetic field profile. Compared with a C magnet, the overall weight of the basic field magnet arrangement according to the disclosure is smaller by a multiple, in particular since an iron yoke, which is usually required in C magnets in order to reduce the stray field, can be dispensed with in this case.

A magnetic resonance tomography system according to the disclosure comprises, usually in addition to the other standard components such as in particular a gradient system, an RF transmit system, an RF receive system, a suitable controller, etc., a basic field magnet arrangement according to the disclosure.

An inventive method for measuring raw data for a magnetic resonance tomography scan, in particular in the context of magnetic resonance tomography imaging, comprises the following steps:

Positioning an Object

During this step, a patient or a test volunteer, or even an inanimate object such as e.g. a phantom, is positioned in a measurement station of a magnetic resonance tomography system according to the disclosure.

Generating a Basic Magnetic Field

This basic magnetic field is generated by means of the inventive basic field magnet arrangement of the magnetic resonance tomography system.

Measuring the Raw Data

In this step, at least one region of interest (RoI) of the object is excited in the conventional manner by means of suitable RF signals or an RF pulse sequence (MR excitation) and the MR signals induced thereby are captured from the RoI in the form of raw data (i.e. the raw data is acquired), which can then be processed further using a wide variety of methods. Methods known to the person skilled in the art may also be used for this purpose. Following appropriate processing, the raw data is preferably used for imaging, i.e. for generating magnetic resonance image data, but may by all means serve also for obtaining other results. During the measurement, i.e. the excitation and/or raw data acquisition, a spatial encoding can also be typically performed here by means of additional gradient fields.

Also part of the disclosure is a use of a toroidal basic magnetic field for a measurement within the context of magnetic resonance tomography and/or in a resonance tomography system. In an exemplary embodiment, a measurement in this case takes place at more than one measurement station within a common toroidal basic magnetic field. Included in what is considered to be a "toroidal" magnetic field, i.e. a magnetic field which is similar to the magnetic field of a toroid, are, in addition to (substantially circular) toroid-shaped magnetic fields themselves, in particular also other inherently closed magnetic fields which have the shape of an ellipse, a rectangle with rounded corners or a shape formed from circular segments and "inserted" straight sections (in particular the shape of a simple racetrack with 180° bends and two straight sections running in opposite directions). In particular, the use concerns the use of an inventive basic field magnet arrangement as described hereinabove.

In a variant according to an exemplary embodiment, the basic field magnet arrangement comprises at least three basic field magnet segments (preferably at least four, further preferably at least six, or particularly preferably at least eight) which are arranged in such a way that the basic magnet main field direction has the shape of a planar ring, preferably substantially of a toroid or a toroid-like shape, in particular the shape of a toroid with inserted straight sections (see above). This means that the segment main field directions of the magnetic fields of the basic field magnet segments all lie in a single common spatial plane.

In a variant of the basic field magnet arrangement according to an exemplary embodiment, the deflection angle of the segment main field directions between at least two adjacent basic field magnet segments amounts to at least 5°, preferably at least 30°, particularly preferably at least 45°. This means that the basic field magnet segments (in respect of their segment main field direction) are correspondingly arranged tilted relative to one another. In this respect, the basic field magnet segments may face toward one another with one of their side walls and the winding or coil planes of adjacent basic field magnet segments are tilted relative to one another. The side walls are in this case the lateral walls in which electric current conductors of the magnet windings run. The side walls could also be referred to as edges. It is therefore not the end faces of a magnet (from which the magnetic field exits and which lie e.g. substantially parallel to a winding plane of a magnetic coil of the basic field magnet segment) that are to be understood as side walls, but the sides in a direction transverse to the segment main field direction of the basic field magnet segment.

In a variant according to an exemplary embodiment, the basic field magnet arrangement comprises at least one group of basic field magnet segments which are arranged in a star shape around at least one spatial axis, a side wall or edges of the respective basic field magnet segment pointing toward the central axis in each case. In an exemplary embodiment, this arrangement is rotationally symmetric, a rotational symmetry of 360°/N particularly preferably being present given N basic field magnet segments (in a group). With six basic field magnet segments, the basic field magnet arrangement would appear e.g. as a six-pointed star. However, a star shape may also comprise a partially regular arrangement of basic field magnet segments, e.g. such that the basic field magnet segments are all arranged at regular intervals within a semicircle. In an exemplary embodiment, an arrangement of a plurality of the partially regular star shapes around multiple central axes or spatial axes, e.g. two oppositely disposed semicircular arrangements spaced apart from one another somewhat in order to generate overall e.g. the already mentioned basic magnetic field in the shape of a toroid with inserted straight sections.

In an exemplary embodiment, the basic field magnet arrangement comprises a basic field magnet segment or a group of basic field magnet segments which is constructed in order to deflect the basic magnet main field direction of the intended basic magnetic field through a total deflection angle of at least 60°, preferably of at least 90°, further preferably of at least 180°. In an exemplary embodiment, the segment main field direction of the magnetic field of the basic field magnet segment or the resulting segment main field direction of the resulting magnetic field of the group (i.e. the segment group main field direction) in this case runs in a curve which represents a deflection through the angles. This basic field magnet segment or this one group of basic field magnet segments can be used to guide the basic magnetic field in a targeted manner.

In particular when, as described above, basic field magnet segments are arranged in a star shape or in a similar manner around a central axis in order to achieve an annularly closed profile of the basic magnet main field direction of the basic magnetic field, and the individual basic field magnet segments are constructed in such a way that they generate a magnetic field that is oriented in a spatial direction perpendicular to their segment main field direction and is substantially homogeneous (i.e. when the basic field magnet segments are constructed for example in the form of Helmholtz coils), this can lead to a basic magnetic field whose field strength, insofar as it (steadily) decreases, is inhomogeneous in the radial direction (starting from the central axis). This is because the distance between the individual basic field magnet segments close to the spatial axis is narrower than at a radially greater distance from the central axis. In other words, the density of the field lines of the resulting basic magnetic field decreases in the radially outward direction.

In an exemplary embodiment, in order to even this out and to achieve a maximally homogeneous basic magnetic field in the radial direction also, a basic field magnet segment (preferably each of the basic field magnet segments) may have, in a variant of the basic field magnet arrangement according to an exemplary embodiment, a coil winding which generates an intended magnetic field that becomes stronger toward one side of the basic field magnet segment, i.e. in a direction transverse to the segment main field direction of the basic field magnet segment. To that end, the coil winding is preferably configured in such a way that the diameter of a winding decreases in at least one spatial direction compared with its neighbor winding and its center point lies closer to one side of the annular basic magnetic field. The magnetic field of the individual basic field magnet segment therefore preferably becomes stronger toward the outer edge of the basic field magnet arrangement (e.g. toward the outer edge of the circular shape, in particular toroidal shape) in order to compensate as effectively as possible for the otherwise occurring radial inhomogeneity of the resulting basic magnetic field as a whole. It may also be said with regard to the basic field magnet segments that the windings gradually tend toward the outer side wall of a basic field magnet segment, i.e. toward the outside of the ring shape of the basic magnetic field. The exact type or topography of the winding is in this case preferably adapted accordingly to the arrangement of the basic field magnet segments relative to one another in order to achieve a suitable compensation for the inhomogeneity.

A magnetic resonance tomography system according to an exemplary embodiment includes a plurality of measurement stations (at least two) within the intended (common) basic magnetic field. In an exemplary embodiment, these measurement stations are in this case arranged between two basic field magnet segments in each case and/or in a patient tunnel within a basic field magnet segment.

In an exemplary embodiment, the magnetic resonance tomography system accordingly comprises for this purpose a plurality of measuring devices (at least two), each of the measuring devices being configured to perform a measurement within the context of magnetic resonance tomography at one of the aforementioned measurement stations. In an exemplary embodiment, the measuring device has for this purpose at least one RF transmit system in each case for applying an RF pulse sequence (i.e. for emitting the RF pulses for MR excitation) and an RF receive system for reading out the MR signals induced thereby. The measuring device can of course comprise further components also, such as e.g. a gradient coil. This will be explained in more detail in the further description.

In particular, the RF transmit system and the RF receive system could also be at least partially combined, for example in that they use a common RF transmit/receive coil (antenna), as is also the case in conventional magnetic resonance tomography systems. For example, a measuring device may for this purpose include a local coil that is to be placed on the object, in particular the patient, and that can be used as an RF transmit coil and/or RF receive coil.

Various suitable measuring devices that could be used, possibly with minor modifications, at the different measurement stations are generally known within the context of magnetic resonance tomography, only a single measuring device per MR system usually being used currently in the prior art, or only one measurement station being present at which a measuring device is optionally used, but in any case only one patient can ever be attended to at any one time.

Within the scope of the disclosure the measuring devices are independent of one another, in particular spatially and/or in terms of measurement functionality. That said, they can however be actuated in a coordinated manner by a common controller, the controller also being able to receive and process the MR signals or raw data. Equally, however, each measuring device may also have its own dedicated controller.

In a method according to an exemplary embodiment, magnetic resonance tomography scans are accordingly performed at at least two measurement stations simultaneously. This means that two objects are examined simultaneously at the measurement stations or where appropriate other measurements are performed. For this, it is however not absolutely necessary that a raw data measurement, i.e. an RF excitation and/or a raw data acquisition, be performed at the same time, as this may also be coordinated in a suitable manner. For example, measurements could be performed alternately in order to avoid mutual interference, i.e. a measurement is always performed at one of the measurement stations (i.e. RF pulses are transmitted and raw data is acquired) while a patient is currently being positioned at another of the measurement stations, a shift in the position of the patient is performed (e.g. a patient couch is moved forward) or a contrast agent is administered. As is well known, the preparation and follow-up time of the examination workflow of course also ties up the magnetic resonance tomography system for a not inconsiderable period of time, which could therefore be used more effectively.

In that respect, therefore, a "simultaneous performance of magnetic resonance tomography scans" should be understood to mean that a "magnetic resonance tomography scan" (sometimes also called simply "imaging") includes the period of time in which all measures associated with a typical MR measurement fall: positioning the patient, administering a contrast agent if necessary, applying a pulse sequence, measuring the MR signals and possibly reconstructing an image, discharging the patient from the examination room, etc., in other words all processes that occupy the MR system. In this case the raw data measurement comprises—as part of the imaging—only the application of a pulse sequence or an RF excitation and a measurement of the MR signals induced thereby. The acquisition of the MR signals itself is also referred to as "raw data acquisition".

A simultaneous performance of magnetic resonance tomography scans therefore means that the time periods of imaging sessions at different measurement stations may coincide or overlap in time. It may be of advantage in this case if, within this commonly occupied time period, active processes that may affect the magnetic field or another measurement are performed separately from one another. Passive processes, i.e. processes that have no effect on another measurement, such as e.g. advancing a patient table or administering a contrast agent, may, as mentioned, by all means be performed simultaneously as a general rule. However, this does not preclude the possibility that active processes or the measurement of raw data may also be performed simultaneously at different measurement stations, depending on the design of the measurement stations and their arrangement relative to one another.

If necessary, when two measurements having different echo times are conducted in parallel for example, the excitations, i.e. the application of signals, could always take place at one measurement station at a time when no signals are applied at the other measurement station. The actual data capture (raw data acquisition) may by all means be performed simultaneously, however. In particular, the scanning of individual slices during two parallel measurements can be performed in an interleaved or alternating manner in this way. In this context, a centrally coordinated control, as has already been described in the foregoing, is extremely advantageous. In an exemplary embodiment, an alignment of gradients of the individual measurements is performed so that these do not e.g. mutually influence one another.

A magnetic resonance tomography system according to an exemplary embodiment includes a controller provided for actuating all the components of the basic field magnet arrangement and of the measuring device(s) of the magnetic resonance tomography system. In an exemplary embodiment, the controller is also configured such that the measurements at different measurement stations are executed in a coordinated sequence, as has been explained in the foregoing.

Some of the components of the controller, in particular components responsible for coordinating the measurements, may be realized wholly or in part in the form of software modules in a processor of a corresponding controller of an MR system. An implementation of such components in large part in the form of software has the advantage that controllers already used previously in the prior art can also be easily upgraded by means of a software update in order to operate in the inventive manner.

In an exemplary embodiment, the controller includes a plurality of subsidiary controllers which are assigned for example to different measurement stations and/or measuring devices and which are able to communicate with one another for coordination purposes and/or are coordinated by means of a higher-ranking master controller.

In an exemplary embodiment, each measuring device may also have its own dedicated gradient system and/or shim coil system, or a separate gradient system and/or shim coil system may be assigned to each measurement station in the magnetic resonance tomography system.

Thus, as already mentioned above, in an exemplary embodiment, the basic field magnet arrangement is configured such that the basic magnetic field at a measurement station is maximally homogeneous. The shim coil system may be used in order to improve the homogeneity even further. For this purpose, it is also possible to revert to prior art methods or principles realized on conventional magnetic resonance tomography systems, which are adapted in a suitable manner if necessary. The desired gradient fields for the measurement can then be applied by means of the gradient system.

In other variants according to exemplary embodiments, however, it is also possible to use an existing known or clearly defined inhomogeneity of the ring-shaped basic magnetic field in a targeted manner, e.g. for spatial encoding of the measurement data or raw data.

To that end, where a magnetic field has a ring-shaped profile, as mentioned above, it is possible in particular to take advantage of the fact that, in the absence of suitable countermeasures, a stronger magnetic field usually prevails toward the center of the ring than at the edge. Generally, the decrease in field strength is antiproportional to the distance from the center of the ring. Since an inhomogeneity of the magnetic field is usually used for spatial encoding within the scope of MR measurements, although this was typically set in the prior art by means of the gradient coil system, an inhomogeneity of the basic magnetic field occurring due to the construction of the basic field magnet arrangement can be used to advantage. At least it is not absolutely necessary to apply a gradient field in the direction of the inhomogeneity, as was done hitherto in the prior art.

It should be mentioned in addition that combinations of the different variants are also possible, i.e. that for example the inhomogeneity of the basic magnetic field is used only in certain spatial directions and additional gradient fields are applied in certain spatial directions or that this is also handled differently from measurement station to measurement station.

In an exemplary embodiment, at least two measurement stations are arranged in areas having an oppositely running basic magnet main field direction. In the case of a toroid-shaped basic magnet main field direction, the measurement stations would be disposed on opposite sides of the basic magnetic field. In an exemplary embodiment, the measurement stations are arranged next to one another and/or lie on a common plane.

As already mentioned above, in an exemplary embodiment, the basic field magnet arrangement of a magnetic resonance tomography system includes a basic field magnet segment or a group of basic field magnet segments which is constructed in order to deflect the basic magnet main field direction of the intended basic magnetic field through a total deflection angle of at least 60°, preferably of at least 90°, further preferably of at least 180°. Such a basic field magnet arrangement may be used also for one or more of the exemplary embodiments in order to deflect the basic magnet main field direction from one measurement station to another measurement station through 180° so that the basic magnet main field direction runs in opposite directions at the measurement stations.

In an exemplary embodiment, a basic field magnet segment or a group of basic field magnet segments is arranged below or above at least one measurement station or on at least one side of a measurement station, the basic field magnet segment or the group of basic field magnet segments preferably adjoining two different measurement stations.

In an exemplary embodiment, a basic field magnet arrangement for a magnetic resonance tomography system includes, between its basic field magnet segments, a plurality of measurement stations which are separated from one another by basic field magnet segments. The measurement stations are therefore located within the intended basic magnetic field. In this arrangement, the measurement stations are preferably disposed between two basic field magnet segments in each case. In an exemplary embodiment, in this context that one basic field magnet segment be embodied as a wall and/or be arranged in a wall between two measurement stations.

In such a basic field magnet arrangement for a magnetic resonance tomography system, in which a plurality of measurement stations are disposed between the basic field magnet segments, gradient coils in the individual measurement stations and/or on the basic field magnet segments are arranged. A basic field magnet arrangement according to an exemplary embodiment includes a local gradient system (local: for a subsection of a measurement station) and/or a global gradient system (global: for the respective measurement station in its entirety).

In an exemplary embodiment, at least one gradient coil is arranged on a basic field magnet segment on at least one side for the purpose of generating a gradient in a spatial axis of the adjacent measurement station, preferably two or even three gradient coils being provided for generating gradients in different spatial axes in each case (x-gradients, y-gradients, z-gradients). In an exemplary embodiment, even if gradient coils are mounted on both sides of a basic field magnet segment so that they can generate gradient fields in different measurement stations, depending on application, a basic field magnet segment includes only a single gradient coil per desired axis. Such a construction may be of advantage in particular in the case of a star-shaped arrangement of basic field magnet segments, since a gradient coil there may serve for generating a gradient (for one spatial axis) for two neighboring measurement stations. The gradient field, as also the basic magnetic field, would in this case form in a toroidal shape, which is very advantageous for suppressing stray fields.

Biplanar gradient coils or a V-shaped arrangement of (in particular planar) gradient coils of a global or local gradient system may be used. Conventional gradient systems may in this case be connected to a basic field magnet arrangement according to the disclosure or be mounted in an MRT system according to the disclosure.

In an exemplary embodiment, a gradient system has two symmetrically arranged coil elements, one on the right-hand side and one on the left-hand side of a measurement station, in which case it is also possible that only one coil element in each case is present per measurement station and a gradient field is developed in combination with the coil element of a respective neighboring measurement station. Each coil element integrates at least one gradient coil for one axis, in particular one gradient coil in each case for all three axes. In an exemplary embodiment, a coil element comprises a stack of planar gradient coils.

The two coil elements could additionally contain shim coils and/or active shielding coils which are configured in such a way that they attenuate the stray gradient fields outside of the imaging volume so that the fields do not penetrate into the adjoining examination regions (measurement stations).

Gradient coils in different measurement stations may in this case be driven independently of one another or in synchronism with one another. The energy supply is typically provided by means of known gradient controllers having power amplifiers. In this case "independently" means that there is no requirement for MR sequences for the relevant measurement stations to be either identical or synchronized, or interleaved in one another.

In an exemplary embodiment, a magnetic resonance tomography system comprising a plurality of measurement stations, one basic field magnet segment (e.g. a basic field magnet) may also be embodied as a wall and/or be arranged in a wall between two measurement stations.

A basic field magnet arrangement according to an exemplary embodiment includes a group of basic field magnet segments arranged at regular intervals in a semicircle. The group can deflect the basic magnetic field through 180°. The arrangement can include a further basic field magnet segment centrally arranged perpendicularly to the semicircle (i.e. effectively standing on the latter) and may be located between the two measurement stations. This will be explained in greater detail later with reference to exemplary embodiments.

Compared with traditional magnetic resonance tomography, which is based on homogeneous basic magnetic fields having rectangular and parallel field lines, this disclosure allows variations in terms of the image acquisition technique, in particular the signal encoding, and the image reconstruction. In this case the signal encoding and the image reconstruction follow the "isofrequency surfaces", i.e. surfaces having the same frequency in the scanned regions. The isofrequency surfaces are curved in a toroidal magnetic field and follow surfaces each having the same magnetic field strength.

FIG. 1 shows a rough schematic view of a magnetic resonance tomography system 1. The latter comprises primarily the actual magnetic resonance scanner 2 having a measurement station 3 or examination room 3, in this case a conventional patient tunnel 3 in which a patient O or test volunteer, i.e. the examination object O, is positioned on a couch 8. Generally, however, it is not the whole patient O that is scanned, but only a region of interest within the patient O, i.e. raw data is acquired from this region only.

The magnetic resonance scanner 2 is equipped in the conventional manner with a basic field magnet system 4 and a gradient system 6, as well as an RF transmit antenna system 5 and an RF receive antenna system 7. In the exemplary embodiment shown, the RF transmit antenna system 5 is a whole-body coil permanently integrated in the magnetic resonance scanner 2, whereas the RF receive antenna system 7 consists of local coils that are to be placed on the patient O or test volunteer. In principle, however, the whole-body coil may also be used as an RF receive antenna system and the local coils as an RF transmit antenna system if the coils can in each case be switched into different modes of operation. The basic field magnet system 4 is in this case embodied in the conventional manner in such a way that it generates a basic magnetic field in the longitudinal direction of the patient, i.e. along the longitudinal axis of the magnetic resonance scanner 2 extending in the z-direction. The gradient system 6 comprises in the conventional manner individually drivable gradient coils in order to enable gradients to be switched independently of one another in the x-, y- or z-direction. The magnetic resonance scanner 2 may furthermore comprise shim coils (not shown) which may be embodied in the conventional manner.

In an exemplary embodiment, the magnetic resonance tomography system 1 additionally comprises a central controller 13, which is used for controlling the MR system 1. The central controller 13 comprises a sequence controller 14. The latter is used to control the sequence of radiofrequency pulses (RF pulses) and gradient pulses as a function of a chosen pulse sequence or a series of multiple pulse sequences for scanning a plurality of slices in a volume region of interest of the examination object O within a measurement session. Such a pulse sequence may be predefined and parameterized within a measurement or control protocol, for example.

Typically, a range of control protocols for different measurements or measurement sessions are stored in a memory 19 and can be selected (and possibly modified as necessary) by an operator and then used for performing the measurement. In the present case the controller 13 contains pulse sequences for measuring the raw data, i.e. for exciting the MR signals used for the acquisition of the raw data.

In order to emit the individual RF pulses of a pulse sequence, the central controller 13 has a radiofrequency transmit device 15 which generates and amplifies the RF pulses and feeds them into the RF transmit antenna system 5 via a suitable interface (not shown in detail). The controller 13 has a gradient system interface 16 for the purpose of controlling the gradient coils of the gradient system 6 in order to switch the gradient pulses in a coordinated manner in accordance with the predefined pulse sequence. The sequence controller 14 communicates in a suitable manner with the radiofrequency transmit device 15 and the gradient system interface 16, e.g. by transmitting sequence control data SD, in order to execute the pulse sequence.

The controller 13 also has a radiofrequency receive device 17 (likewise communicating in a suitable manner with the sequence controller 14) in order to receive magnetic resonance signals within the readout windows predefined by the pulse sequence in a coordinated manner by means of the RF receive antenna system 7 and thus acquire the raw data.

A reconstructor 18 in this case imports the acquired raw data and reconstructs magnetic resonance image data therefrom. Generally, this reconstruction is also performed on the basis of parameters that may be predefined in the respective measurement or control protocol. The image data may then be stored in a memory 19, for example.

The details of how RF pulses are applied and gradient pulses switched in order to acquire suitable raw data and reconstruct MR images or parameter maps therefrom are generally known to the person skilled in the art and will therefore not be explained in further depth here.

The central controller 13 can be operated by way of a terminal 11 having an input 10 and a display 9, thus enabling the entire magnetic resonance tomography system 1 also to be controlled by an operator. Magnetic resonance tomography images may also be displayed on the display 9, and measurements can be planned and started by means of the input 10, possibly in combination with the display 9, and in particular control protocols may be selected and modified if necessary.

Such a magnetic resonance tomography system 1 and in particular the controller 13 may furthermore also comprise a plurality of further components that are not shown here specifically, but are typically present in installations of the type, such as, for example, a network interface in order to connect the system as a whole to a network and to enable raw data and/or image data or parameter maps, as well as further data, such as, for example, patient-related data or control protocols, to be exchanged. In an exemplary embodiment, the controller 13 includes processor circuitry that is configured to perform one or more functions and/or operations of the controller 13. Once or more components therein may additionally include respective processor circuitry that is configured to perform one or more respective functions.

Figure 2:
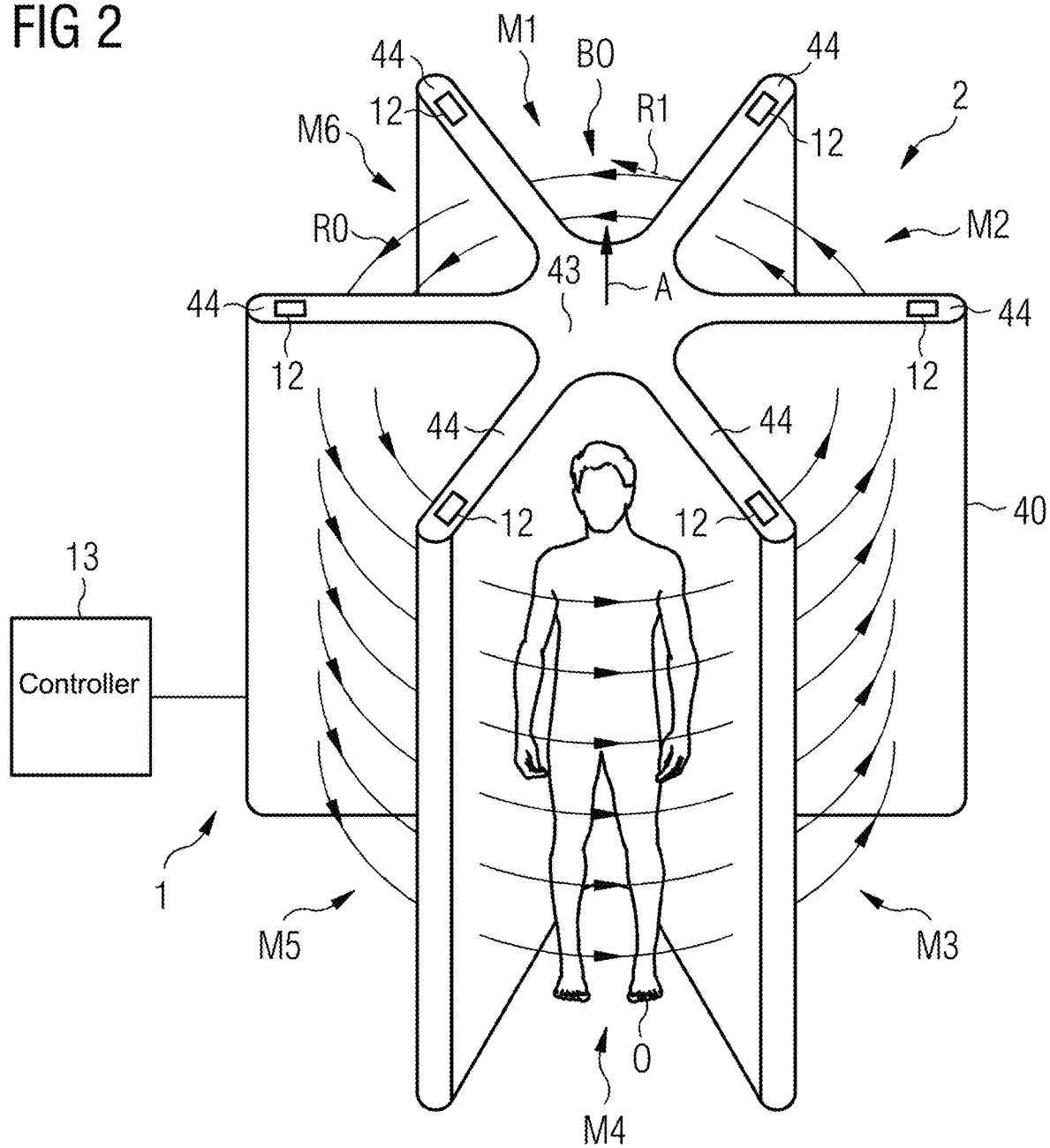
FIG. 2 shows a magnetic resonance tomography system having a basic field magnet arrangement according to an exemplary embodiment of the disclosure.

FIG. 2 shows an exemplary embodiment of a magnetic resonance tomography system 1 having a basic field magnet arrangement 40 according to the disclosure.

Depicted in this figure is a magnetic resonance scanner 2, the operation of which can be controlled by a controller 13. In this case the controller 13 may in principle be constructed in a similar manner to and have the same components as the controller 13 in a conventional MR system according to FIG. 1. Equally, the device may also have a suitable terminal or the like (though this is not shown here).

The basic field magnet arrangement 40 of the magnetic resonance scanner 2 in this case comprises six (in this example, identical) basic field magnet segments 44, which in this embodiment variant are arranged in a star shape around a central axis A having a rotational symmetry of 60°. The basic magnetic field B0 indicated by arrows has a basic field main direction R0 which extends in the shape of a circle or a toroidal magnetic field.

Figure 3:
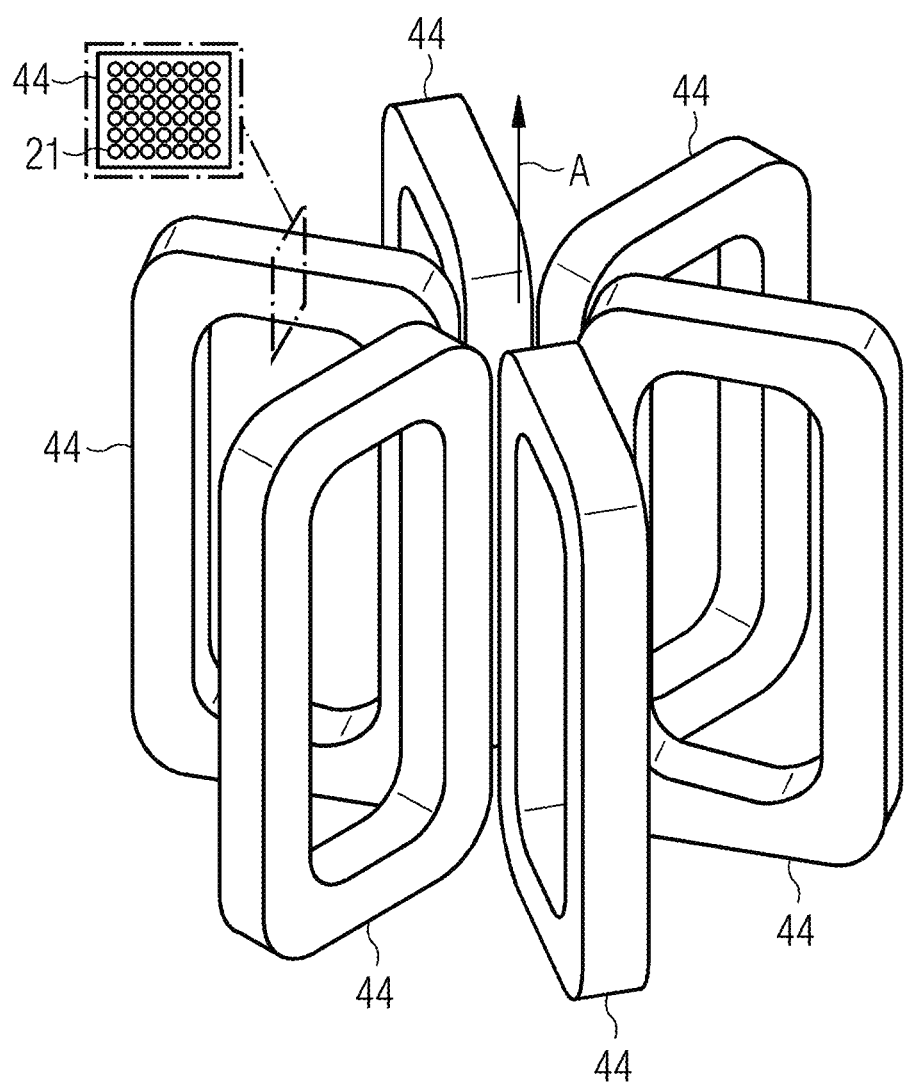
FIG. 3 shows a schematic view of a basic field magnet arrangement according to an exemplary embodiment that may be used in the system of FIG. 2.

FIG. 3 shows in this regard a detailed schematic view of the individual basic field magnet segments 44 of the star-shaped basic field magnet arrangement 40 in FIG. 2.

What can be seen here are six Helmholtz coils as basic field magnet segments 44 of the basic field magnet arrangement 40. They are oriented by one edge of their coil or winding plane toward the central axis A. Each individual basic field magnet segment 44 has an intended magnetic field corresponding to that of a (relatively short) solenoid, i.e. the segment main field direction R1 (shown in the view in FIG. 2 only on one of the two basic field magnet segments 44 at the rear) of the magnetic field generated by an individual basic field magnet segment 44 would in each case stand perpendicularly to the end face of the basic field magnet segment 44 in question. Collectively, the individual magnetic fields of the basic field magnet segments 44 result in the basic magnetic field B0 indicated in FIG. 2 having a toroidal basic magnet main field direction R0, the segment main field direction R1 in the center of the individual basic field magnet segments 44 in each case standing "tangentially" to the circular basic magnet main field direction R0. The basic magnetic field B0 decreases toward the outside in the radial direction, although it is homogeneous in terms of height.

The basic field magnet segments 44 of the basic field magnet arrangement 40 are interconnected with one another in such a way that a direct current flows from one basic field magnet segment 44 into the next, the current direction through the magnet windings being always the same and the circular magnetic field B0 being formed by the current flow as a whole.

A significant advantage of such a symmetric arrangement is the structural stability achieved when the basic magnetic field B0 is turned on. The magnetic forces between the individual basic field magnet segments 44 cancel one another out in the direction of the basic magnet main field direction R0. Each basic field magnet segment 44 is attracted by the same force by each of its two neighbors. The resulting forces act inwardly toward the column 43 and can be compensated for very effectively there by means of corresponding structural reinforcements.

The inset shown in magnified form in the top left-hand corner of FIG. 3 is a section through a basic field magnet segment 44. What can be seen is a regular arrangement of electric current conductors 21, which are drawn here as wires, but may by all means have a complex structure, e.g. may be hollow in order to conduct a coolant.

Such a magnetic resonance tomography system 1 having a basic field magnet arrangement 40 according to FIGS. 2 and 3 permits measurements at six different measurement stations M1, M2, M3, M4, M5, M6 (see FIG. 2), wherein a measurement of an object O takes place in the illustrated example specifically at measurement station M4, wherein a patient is in this case standing upright at vertical walls of the basic field magnet arrangement 40. Theoretically, measurements could take place at all six measurement stations M1, M2, M3, M4, M5, M6 simultaneously. A central column 43 holds the basic field magnet segments 44 in place and may also comprise technical components, such as e.g. the electrical connections or even the power supply (see e.g. FIG. 4).

At each of the measurement stations M1, M2, M3, M4, M5, M6 there may be disposed measuring devices 12 (only represented symbolically in each case) or the components necessary for this at the measurement station M1, M2, M3, M4, M5, M6 in each case, such as an RF transmit coil of an RF transmit system, an RF receive coil of an RF receive system and/or a common RF transmit/receive coil. Gradient and/or shim coils 6a may also belong to this configuration. All these components can be actuated in a coordinated manner by the common controller 13.

A magnetic resonance scanner 2 may of course also comprise more than six measurement stations M1, M2, M3, M4, M5, M6, its height may be lower or it is configured for conducting examinations of small regions of the body, e.g. for head examinations or examinations of the extremities, of the female breast, the prostate, the liver, kidneys or other organs. The star-shaped basic field magnet arrangement 40 could also be disposed in a lying position.

Figure 4:
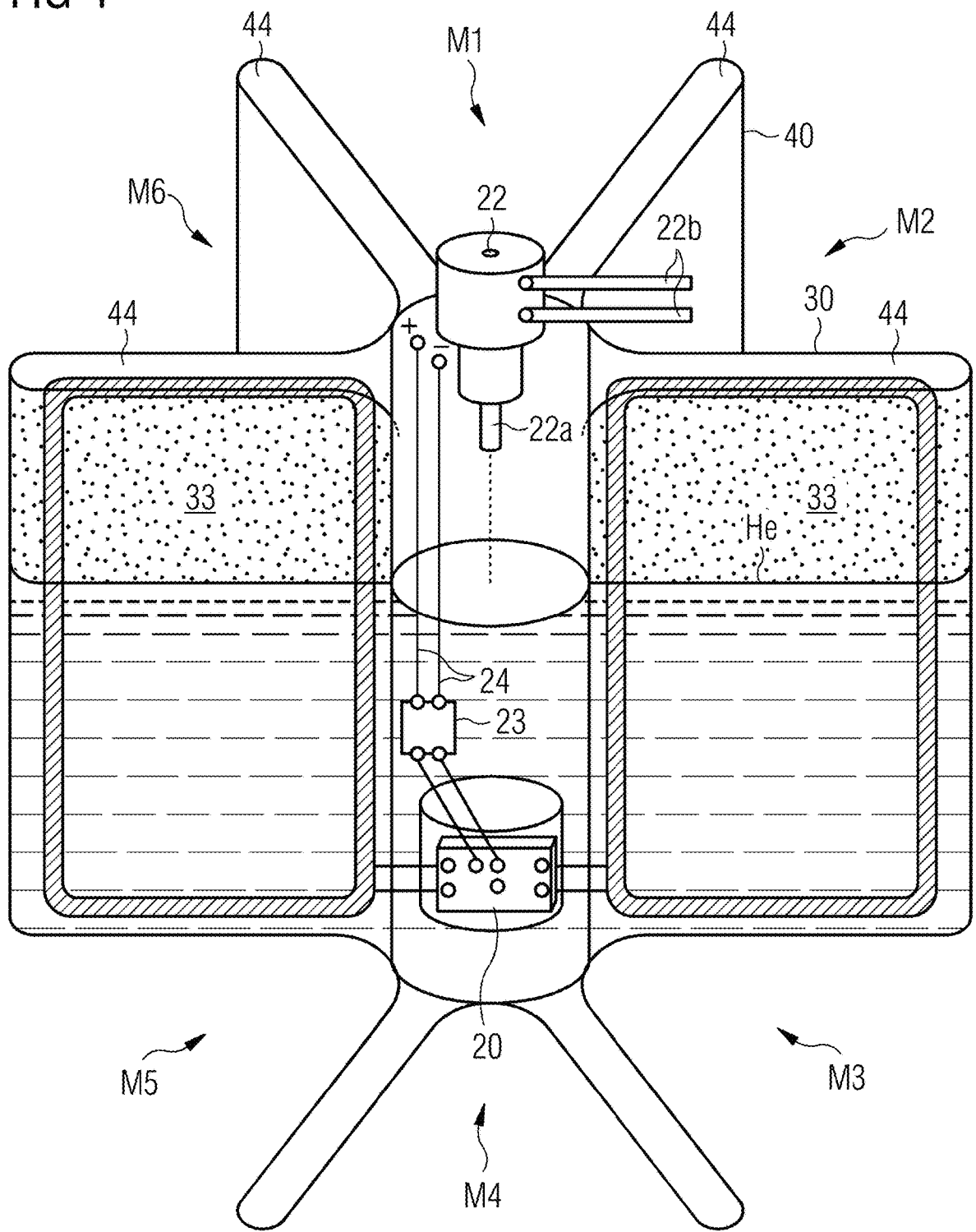
FIG. 4 shows a basic field magnet arrangement according to an exemplary embodiment that may be used in the system of FIG. 2.

FIG. 4 shows an exemplary embodiment of a magnetic resonance tomography system 1 having a superconducting basic field magnet arrangement 40. This could be a superconducting version of the embodiment variant shown in FIG. 2. To provide a better illustration of the internal structure, the front two basic field magnet segments 44 are not shown. It can be seen that the basic field magnet arrangement 40 is filled with helium He which is partially liquid and partially gaseous. The reference sign for the helium He points here to the liquid level. The entire basic magnetic field arrangement 40 is surrounded by a housing wall 30 which in this case includes in particular a thermal insulation means so that the helium He in the housing interior 33 remains cold and therefore liquid.

Such an insulation means may comprise e.g. multilayer insulating foils or thermally conductive shields against ambient thermal radiation.

Mounted at the top in the center of the basic field magnet arrangement 40 is a cooler 22 having a cooling finger 22a on which helium He constantly condenses and drips downward. The helium content and the pressure in the basic field magnet arrangement 40 can be regulated by means of a helium line 22b. Shown at the bottom is a superconducting joints box 20 connected to a switch 23 which can supply the basic field magnet arrangement 40 with electric current via power supply leads 24. The switch 23 can be used here as a persistent switch in order to generate a constantly circulating current and consequently a permanent basic magnetic field B0 in the superconducting basic field magnet arrangement 40.

However, other cooling alternatives are also possible, e.g. cooling by passing liquid helium through hollow conductors of the magnets or by means of additional cooling lines in good thermal contact with the magnetic coils. Further components (not shown here for clarity of illustration reasons) may also be included in the construction of the basic field magnet arrangement 40, such as e.g. a quench detector or protector, a so-called "coil carrier" (magnet former) or structural reinforcements.

Figure 5:
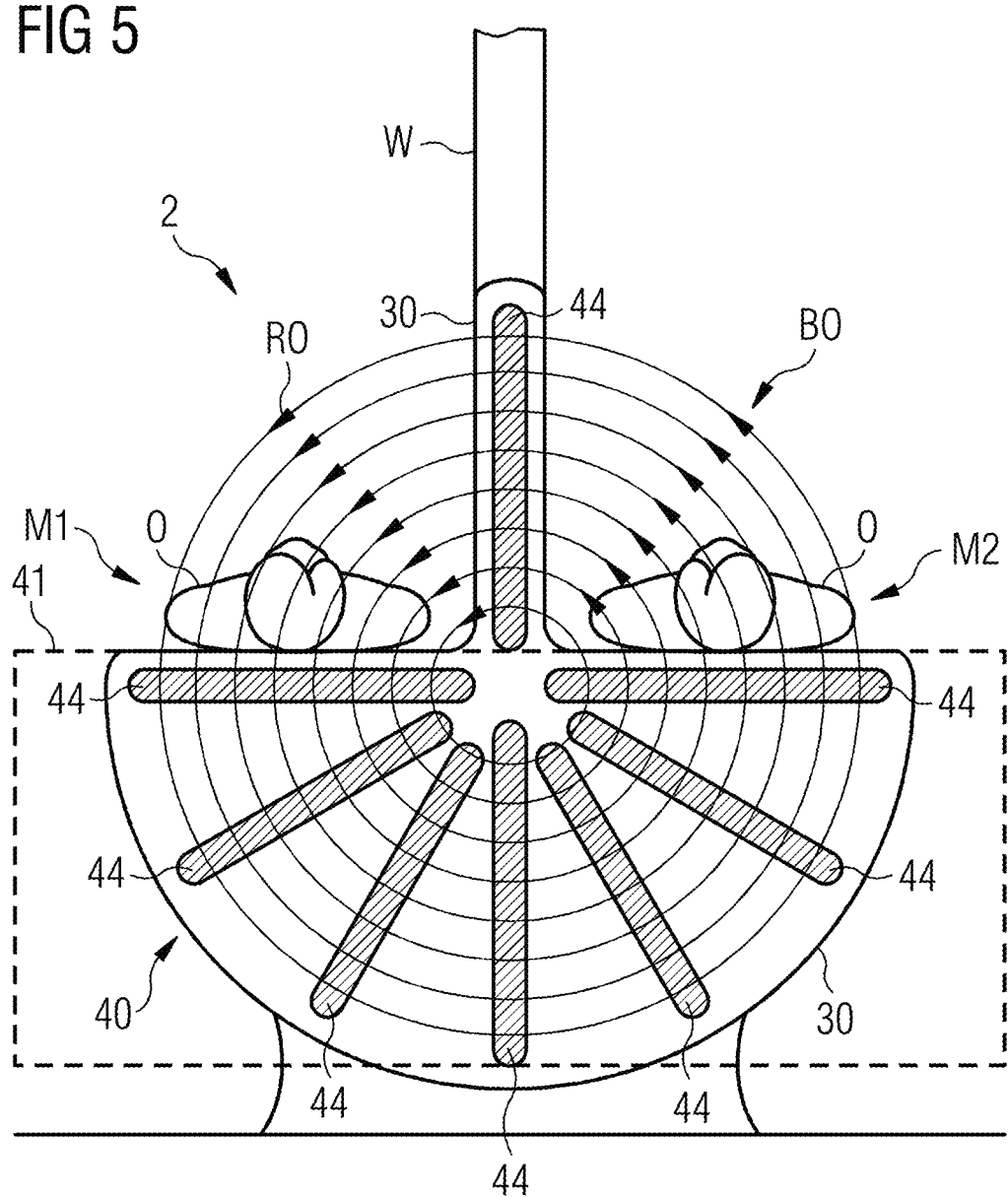
FIG. 5 shows a magnetic resonance tomography system having a basic field magnet arrangement according to an exemplary embodiment of the disclosure.

FIG. 5 shows a further exemplary embodiment of a magnetic resonance scanner 2 having a basic field magnet arrangement 40 according to the disclosure. Here, only the lower half of the basic field magnet arrangement 40 is designed as a group 41 of basic field magnet segments 44 in the shape of a star and a further basic field magnet segment 44 projects upward and serves both for guiding the basic magnetic field B0 and also as part of a wall W between two measurement stations M1, M2 on which two patients O are positioned in this case. In the diagram it can be seen that the lower part of the wall W between the two patients O is formed by the housing wall 30 of the magnetic resonance scanner 2 into which the basic field magnet segment 44 is integrated between the measurement stations M1, M2. The wall W may serve not only as a privacy screen, but also as an acoustic shield or an RF shield.

The basic magnetic field B0 of the magnetic resonance scanner 2 becomes weaker toward the outside, which may be used for spatial encoding, and is homogeneous in the longitudinal direction (orthogonally to the image plane). It is basically identical in terms of its shape in the two measurement stations M1, M2, with the only difference being that the profile (in a direction through the surface on which the patient O is supported) is reversed. In this case too, as in FIG. 2, the dimensions of the magnetic resonance scanner 2 may by all means be chosen differently.

The basic magnet main field direction R0 is circular in this case also. A special feature in this embodiment variant is that the patients O do not lie in a confined space, but have an unobstructed view toward the ceiling. The inhomogeneity normally produced in the basic magnetic field B0 due to the curvature can be used, as mentioned, for the spatial encoding of a spatial direction such that for the spatial encoding as a whole it is simply necessary to apply gradients in the other spatial direction.

Owing to its open design and the toroidal magnetic field, this arrangement allows easy and largely unrestricted access to the patient. Thanks to the special construction, magnetic forces as in FIG. 2 are largely compensated for or are diverted into areas which can be structurally strengthened to good effect.

Figure 6:
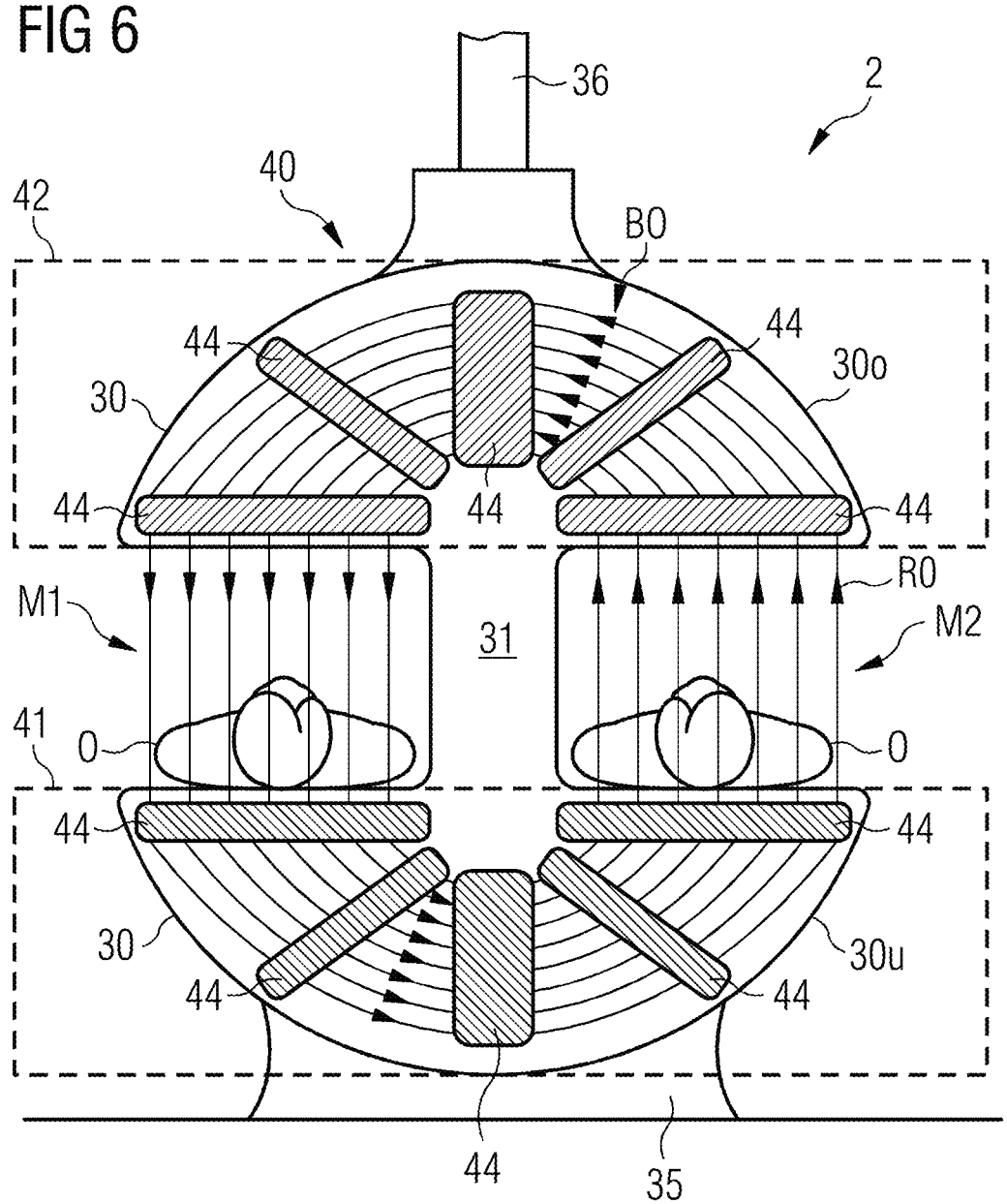
FIG. 6 shows a magnetic resonance tomography system having a basic field magnet arrangement according to an exemplary embodiment of the disclosure.

FIG. 6 shows a further exemplary embodiment of a magnetic resonance scanner 2 having a basic field magnet arrangement 40 according to the disclosure. This is similar in construction to that in FIG. 5, with the difference that a group 41, 42 of basic field magnet segments 44 is now located above and below the two measurement stations M1, M2. As can be seen from the indicated profile of the magnetic field lines, the profile of the intended basic magnetic field B0 is very homogeneous here in the region of the measurement stations M1, M2.

The housing 30 in this case comprises a lower and an upper semicylindrical housing section 30u, 30o, each having a cross-section in the shape of a 180° circular segment, in each of which a group 41, 42 of basic field magnet segments 44 is accommodated. The groups 41, 42 of basic field magnet segments 44 are kept spaced apart from one another by means of a central bridge or demarcation element 31 which is part of the housing 30, the semicylinders of the housing sections 30u, 30o each facing toward one another with their flat side, thereby providing two measurement stations M1, M2 between the housing sections 30u, 30o. The lower semicylindrical housing section 30u stands on a base part 35 and the upper semicylindrical housing section 30o can be additionally secured by a ceiling-mounted retaining fixture 36. In this arrangement, the demarcation element 31 serves simultaneously as a partition or wall W between the two measurement stations M1, M2.

Compared with the construction according to FIG. 5, the construction shown here is aimed at generating a homogeneous magnetic field at the two measurement stations M1, M2. The spatial openness of such a magnetic resonance scanner 2 is comparable with a C magnet system, though in contrast to such a system there is no need for a solid iron yoke for shielding or redirecting the magnetic field lines. Instead, the group 41, 42 of basic field magnet segments 44 is used for shielding and guiding the basic magnetic field B0, thus substantially reducing the weight.

Figure 7:
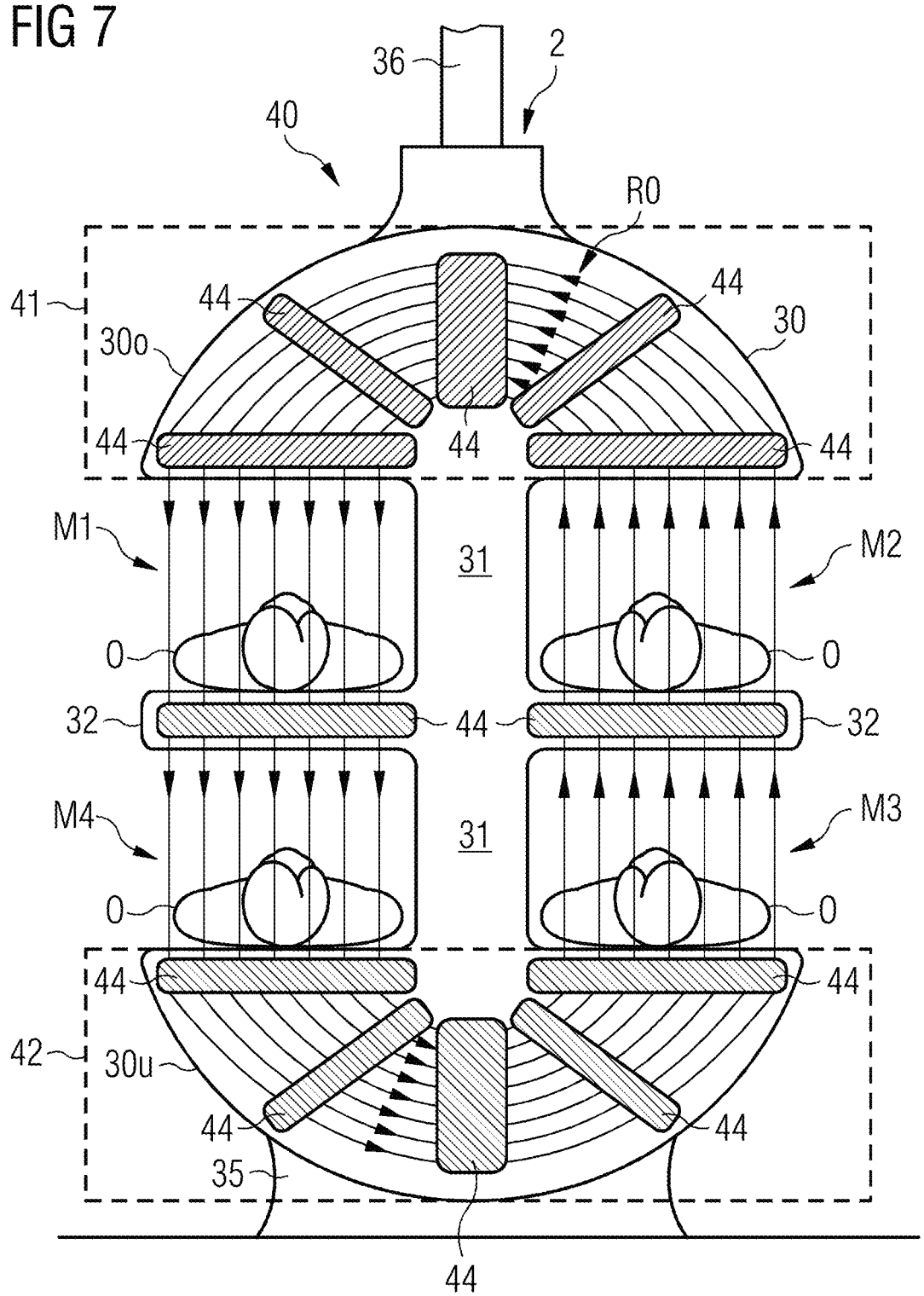
FIG. 7 shows a magnetic resonance tomography system having a basic field magnet arrangement according to an exemplary embodiment of the disclosure.

FIG. 7 shows a further exemplary embodiment of a magnetic resonance tomography system 1 having a basic field magnet arrangement 40 according to the disclosure. This is very similar to the construction according to FIG. 6, with the difference that in this case there are now four measurement stations M1, M2, M3, M4 present instead of two. Two of the measurement stations M1, M2, M3, M4 are arranged one above the other in each case, the upper one being separated from the lower one in each case by means of a base element 32 of the housing 30. The base element 32 simultaneously serves as a receptacle for a basic field magnet segment 44 which guides the magnetic field in the magnetic resonance scanner 2 homogeneously through the measurement stations M1, M2, M3, M4. The base elements 32 may for example be anchored to the central bridge or demarcation element 31 of the housing 30 serving as a partition or wall W between the respective neighboring measurement stations M1, M2, M3, M4 or extend sideways out of the same.

Figure 8:
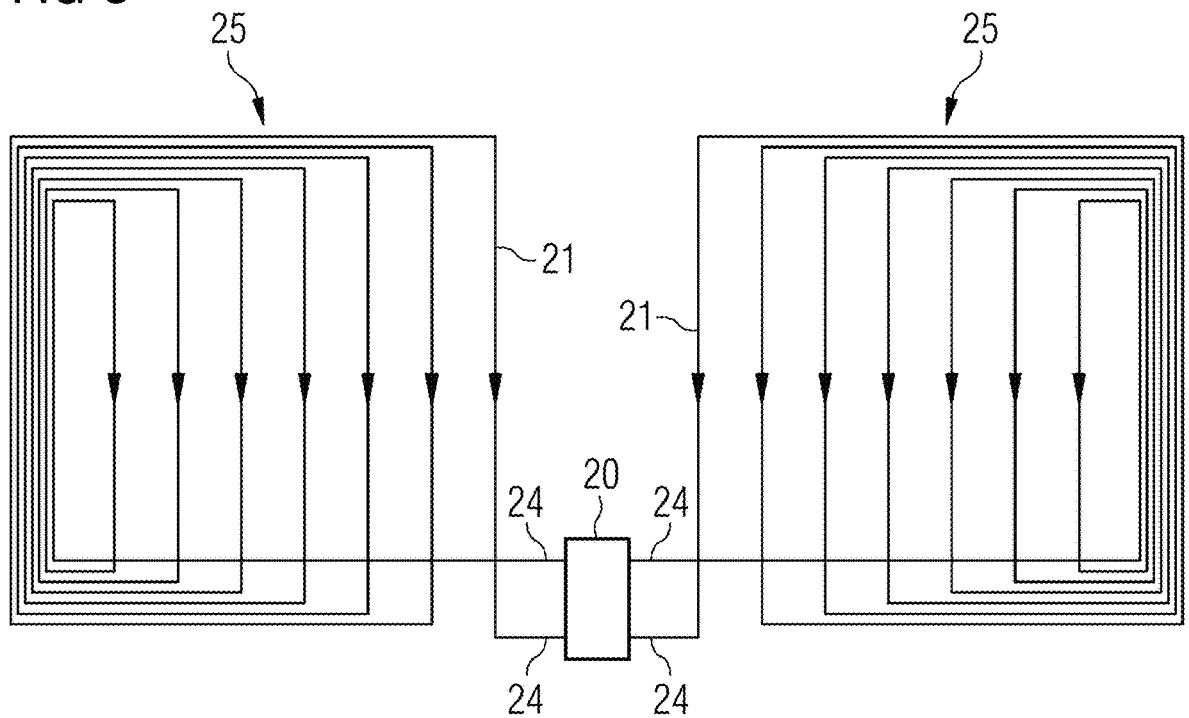
FIG. 8 shows a schematic view of a coil winding according to an exemplary embodiment that may be used in the basic field magnet arrangements according to FIGS. 1 to 7.

FIG. 8 shows a schematic view of coil windings 25 composed of electric current conductors 21 for compensating for inhomogeneities in an annular magnetic field, as may be used within the scope of the disclosure. It is possible to visualize the windings being present in oppositely disposed basic field magnet segments 44 in FIG. 3. As can clearly be seen, the coil windings 25 are designed in such a way that the diameter of a winding decreases in one spatial direction (namely the horizontal in this case) compared with its neighbor winding, and its center point lies closer to an outside edge of the annular basic magnetic field BO than the center point of the larger winding. As a result, an intended magnetic field (of a respective basic field magnet segment 44) is generated which becomes stronger in each case toward the outside faces of the basic field magnet segments 44. Given a suitable construction, this enables the inhomogeneity of the basic magnetic field BO extending in the radial direction, as described in connection with FIGS. 2, 3 and 5, to be compensated for, at least partially, preferably completely.

Figure 9:
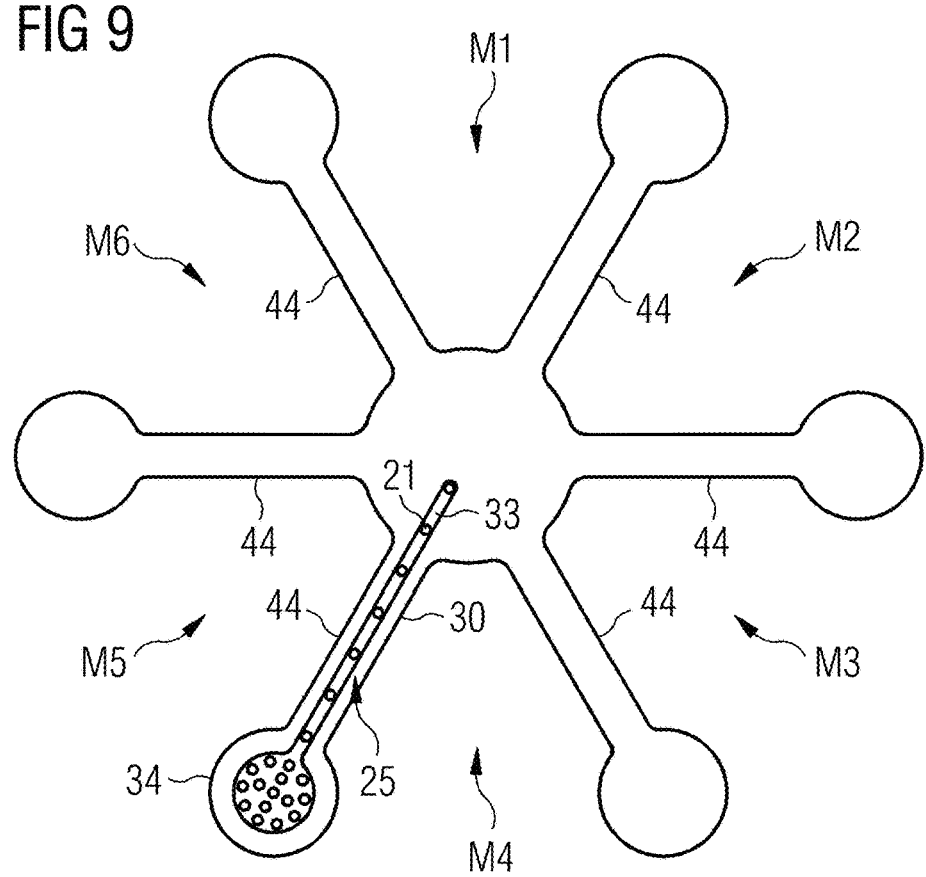
FIG. 9 shows a basic field magnet arrangement according to an exemplary embodiment that includes a coil winding as in in FIG. 8.

FIG. 9 shows a schematic view from above onto an embodiment variant illustrated in FIG. 2 having a coil winding 25 according to FIG. 8. Only one basic field magnet segment 44 is provided with a detail drawing in this case. It should be assumed that all the other basic field magnet segments 44 are also constructed in such a way.

The density of the electric current conductors 21 may also increase with increasing radial distance.

The coil winding 25 is accommodated in a housing interior 33 of the housing 30. Since the number of electric current conductors 21 (for clarity of illustration reasons, only one is designated) is very high at the edge and otherwise the density is regular across the width of a basic field magnet segment 44, the basic field magnet arrangement 40 has thicker extremities in which the electric current conductors are routed in a bundled manner at the outer end sections 34 of the side walls of the basic field magnet segments 44.

Figure 10:
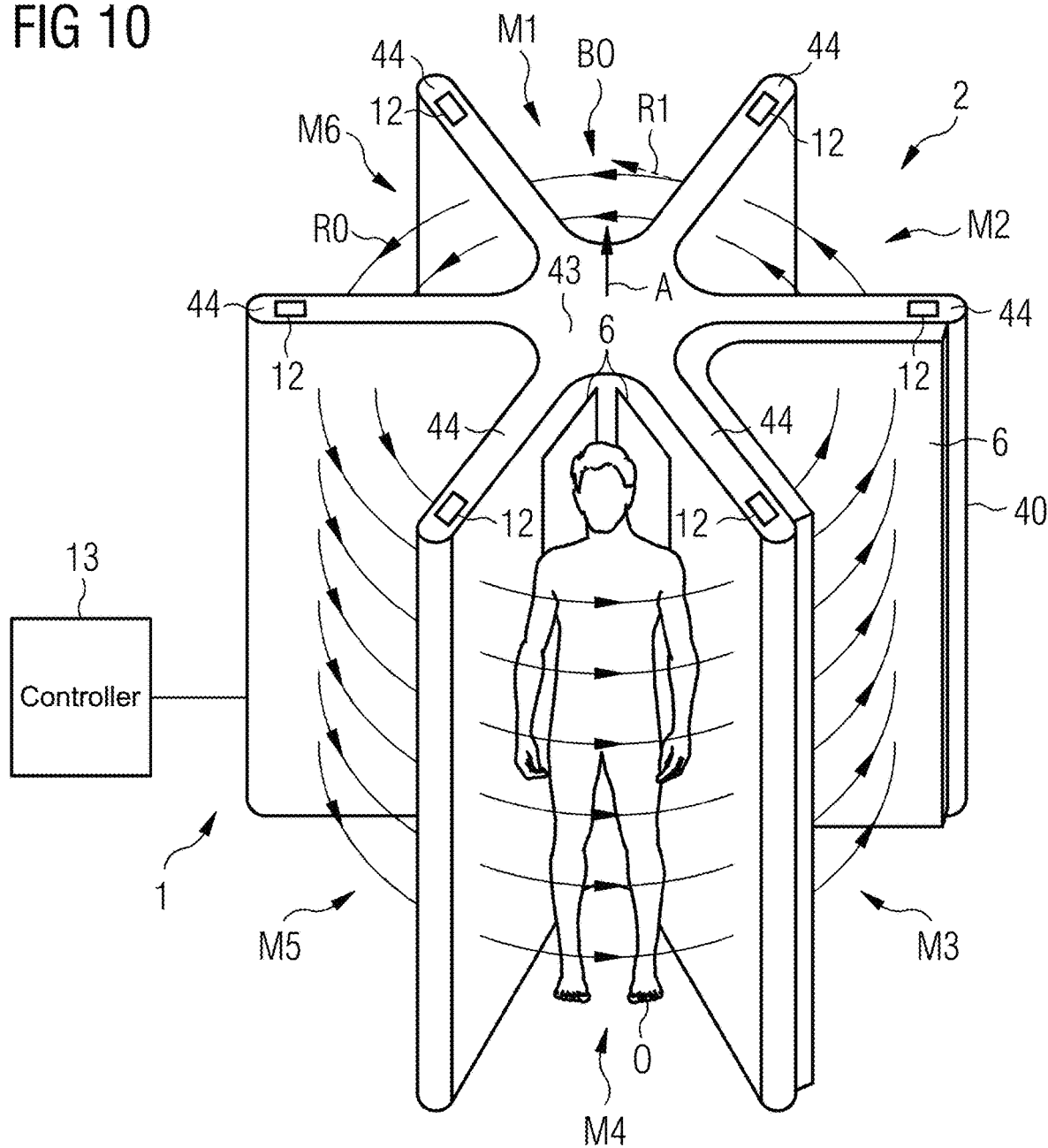
FIG. 10 shows gradient systems in magnetic resonance tomography (MRT) system according to an exemplary embodiment of the disclosure.

FIG. 10 shows two gradient systems 6, a local and a global gradient system 6, in an MRT system 1 according to the disclosure, as is depicted in FIG. 2 for example and has been described hereinabove. The local gradient system 6 (shown by way of example only at the front measurement station M4 in FIG. 10) serves for imaging the head, while the global system serves for imaging the entire body of a patient. In an exemplary embodiment, the gradient coils of a local gradient system 6 are integrated in the headrest of a patient chair and secured there (not shown), though they may also be mounted in the head region for a patient in a standing position. The coils of a global gradient system 6 (shown by way of example only at the measurement station M3 located at front right in FIG. 10) are preferably fastened on basic field magnet segments 44. In an exemplary embodiment, each of the measurement stations M1, M2, M3, M4, M5, M6 can be equipped with a local and/or global gradient system 6.

In conclusion, it is pointed out once again that the embodiment variants described in detail in the foregoing, as well as the illustrated magnetic resonance tomography system 1 or the basic field magnet arrangement 40, are simply exemplary embodiments which may be modified in the most diverse ways by the person skilled in the art without leaving the scope of the disclosure. Thus, it is clear that for example all the magnetic resonance scanners or MR systems described may be equipped with corresponding controllers and other additional components, as illustrated for example in FIGS. 1 and/or 2, even if these are not explicitly shown in the figures in each case. Furthermore, the use of the indefinite articles "a" or "an" does not exclude the possibility that the features in question may also be present more than once. Similarly, the terms "unit" and "arrangement" do not rule out the possibility that the components in question consist of a plurality of cooperating subcomponents, which if necessary may also be distributed in space.

Any connection or coupling between functional blocks, devices, components of physical or functional units shown in the drawings and described hereinafter may be implemented by an indirect connection or coupling. A coupling between components may be established over a wired or wireless connection. Functional blocks may be implemented in hardware, software, firmware, or a combination thereof.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A basic field magnet arrangement for a magnetic resonance tomography system, the basic field magnet arrangement comprising:
   a plurality of basic field magnet segments spatially separated from one another, each being configured to generate an intended magnetic field having a defined segment main field direction, wherein at least two basic magnet segments of the plurality of the basic field magnet segments are arranged relative to one another such that the respective segment main field directions of their intended magnetic fields extend at a deflection angle to one another such that the intended magnetic fields of the at least two basic field magnet segments produce an intended basic magnetic field, the intended basic magnetic field including a basic magnet main field direction having a ring-shaped profile; and
   a plurality of measurement stations within the intended basic magnetic field, the plurality of measurement stations being arranged between two basic field magnet segments of the plurality of basic field magnet segments, and/or arranged in a patient tunnel within a basic field magnet segment of the plurality of basic field magnet segments, wherein one basic field magnet segment of the plurality of basic field magnet segments is arranged in a wall between two measurement stations of the plurality of measurement stations.

2. The basic field magnet arrangement as claimed in claim 1, comprising at least three basic field magnet segments which are arranged such that the basic magnet main field direction has a shape of a planar ring.

3. The basic field magnet arrangement as claimed in claim 1, comprising at least three basic field magnet segments which are arranged such that the basic magnet main field direction has a shape of a toroid or a toroid with inserted straight sections.

4. The basic field magnet arrangement as claimed in claim 1, wherein the respective deflection angle of the segment main field directions of the magnetic fields of the two adjacent basic field magnet segments amounts to at least 5°.

5. The basic field magnet arrangement as claimed in claim 1, wherein the respective deflection angle of the segment main field directions of the magnetic fields of the two adjacent basic field magnet segments amounts to at least 45°.

6. The basic field magnet arrangement as claimed in claim 1, wherein the plurality of basic field magnet segments include at least one group of basic field magnet segments which are arranged in a star shape, rotationally symmetrically, around at least one central axis, and wherein, given N basic field magnet segments, a rotational symmetry of 360°/N is present.

7. The basic field magnet arrangement as claimed in claim 1, wherein a basic field magnet segment or a group of basic field magnet segments, of the plurality of basic field magnet segments, is configured to deflect the basic magnet main field direction of the intended basic magnetic field through a total deflection angle of at least 60°.

8. The basic field magnet arrangement as claimed in claim 1, wherein a basic field magnet segment or a group of basic field magnet segments, of the plurality of basic field magnet segments, is configured to deflect the basic magnet main field direction of the intended basic magnetic field through a total deflection angle of at least 180°.

9. The basic field magnet arrangement as claimed in claim 1, wherein:
   a basic field magnet segment of the plurality of basic field magnet segments comprises a coil winding configured to generate an intended magnetic field that becomes stronger in a direction transverse to a segment main field direction of the basic field magnet segment, and
   the coil winding is configured such that a diameter of a winding of the coil winding decreases in at least one spatial direction compared with a neighboring winding of the coil winding, and a center point of the coil winding lying closer to an external side wall of the basic field magnet segment.

10. A magnetic resonance tomography system comprising:
    a basic field magnet arrangement including a plurality of basic field magnet segments spatially separated from one another, each being configured to generate an intended magnetic field having a defined segment main field direction, wherein at least two basic magnet segments of the plurality of the basic field magnet segments are arranged relative to one another such that the respective segment main field directions of their intended magnetic fields extend at a deflection angle to one another such that the intended magnetic fields of the at least two basic field magnet segments produce an intended basic magnetic field, the intended basic magnetic field including a basic magnet main field direction having a ring-shaped profile; and
    a plurality of measurement stations within the intended basic magnetic field, the plurality of measurement stations being arranged between two basic field magnet segments of the plurality of basic field magnet segments, and/or arranged in a patient tunnel within a basic field magnet segment of the plurality of basic field magnet segments, wherein one basic field magnet segment of the plurality of basic field magnet segments is arranged in a wall between two measurement stations of the plurality of measurement stations.

11. The magnetic resonance tomography system as claimed in claim claim 10, wherein at least two measurement stations of the plurality of measurement stations are arranged in areas having an oppositely running basic magnet main field direction, the at least two measurement stations being arranged next to one another and lie on one plane.

12. The magnetic resonance tomography system as claimed in claim 10, wherein:
    the plurality of basic field magnet segments of the basic field magnet arrangement includes a basic field magnet segment or a group of basic field magnet segments that is configured to deflect the basic magnet main field direction of the intended basic magnetic field through a total deflection angle of at least 180°, the basic field magnet segment or the group of basic field magnet segments is arranged below or above at least one measurement station of the plurality of measurement stations or is arranged on at least one side of a measurement station of the plurality of measurement stations, and the basic field magnet segment or the group of basic field magnet segments adjoins two different measurement stations of the plurality of measurement stations.

13. The magnetic resonance tomography system as claimed in claim 10, further comprising: a plurality of measuring devices independent of one another, each of the measuring devices being configured to perform a measurement within a context of a magnetic resonance tomography imaging session at one of the measurement stations of the plurality of measurement stations.

14. A method for measuring raw data for a magnetic resonance tomography scan, comprising:

positioning an examination object in a measurement station of a plurality of measurement stations of a magnetic resonance tomography system that includes:

a basic field magnet arrangement including a plurality of basic field magnet segments spatially separated from one another, each being configured to generate an intended magnetic field having a defined segment main field direction, wherein at least two basic magnet segments of the plurality of the basic field magnet segments are arranged relative to one another such that the respective segment main field directions of their intended magnetic fields extend at a deflection angle to one another such that the intended magnetic fields of the at least two basic field magnet segments produce an intended basic magnetic field, the intended basic magnetic field including a basic magnet main field direction having a ring-shaped profile; and the plurality of measurement stations that are within the intended basic magnetic field, the plurality of measurement stations being arranged between two basic field magnet segments of the plurality of basic field magnet segments, and/or arranged in a patient tunnel within a basic field magnet segment of the plurality of basic field magnet segments, wherein one basic field magnet segment of the plurality of basic field magnet segments is arranged in a wall between two measurement stations of the plurality of measurement stations;

generating the intended basic magnetic field using the basic field magnet arrangement of the magnetic resonance tomography system; and measuring the raw data using the intended basic magnetic field generated by the magnetic resonance tomography system.

15. The method as claimed in claim 14, wherein an inhomogeneity of the basic magnetic field is used for spatial encoding of the raw databased on the ring-shaped profile of the basic magnet main field direction.

16. The method as claimed in claim 14, further comprising performing magnetic resonance tomography scans at the plurality of measurement stations simultaneously.

17. The method as claimed in claim 14, wherein the magnetic resonance tomography system is configured to generate a common toroidal basic magnetic field as the intended basic magnetic field, and wherein measuring the raw data uses the common toroidal basic magnetic field the method including.

18. A non-transitory computer-readable storage medium with an executable program stored thereon, that when executed, instructs a processor to perform the method of claim 14.

19. A computer program product having a computer program which is directly loadable into a memory of the magnetic resonance tomography system, when executed by a processor of the magnetic resonance tomography system, causes the processor to perform the method as claimed in claim 14.

* * * * *